United States Patent [19]
Walter

[11] 3,944,416
[45] Mar. 16, 1976

[54] DIRECTIONALLY SOLIDIFIED NICKEL-BASE EUTECTIC ALLOYS

[75] Inventor: John L. Walter, Scotia, N.Y.

[73] Assignee: General Electric Company, Schenectady, N.Y.

[22] Filed: June 24, 1974

[21] Appl. No.: 482,589

[52] U.S. Cl. .................. 75/170; 75/171; 148/32; 148/32.5
[51] Int. Cl.² .......................................... C22C 19/03
[58] Field of Search ........ 75/171, 170; 148/32, 32.5

[56] References Cited
UNITED STATES PATENTS
3,526,499  9/1970  Quigg et al. .................... 75/171

Primary Examiner—R. Dean
Attorney, Agent, or Firm—F. Wesley Turner; Joseph T. Cohen; Jerome C. Squillaro

[57] ABSTRACT

A directionally solidified casting having improved high temperature properties is provided having a nickel-base matrix and comprising in weight percent of at least 2% rhenium and at least 6% tungsten, but less than 4% aluminum and less than 7% chromium. Embedded in the matrix is an aligned tantalum carbide reinforcing fibrous phase.

12 Claims, 7 Drawing Figures

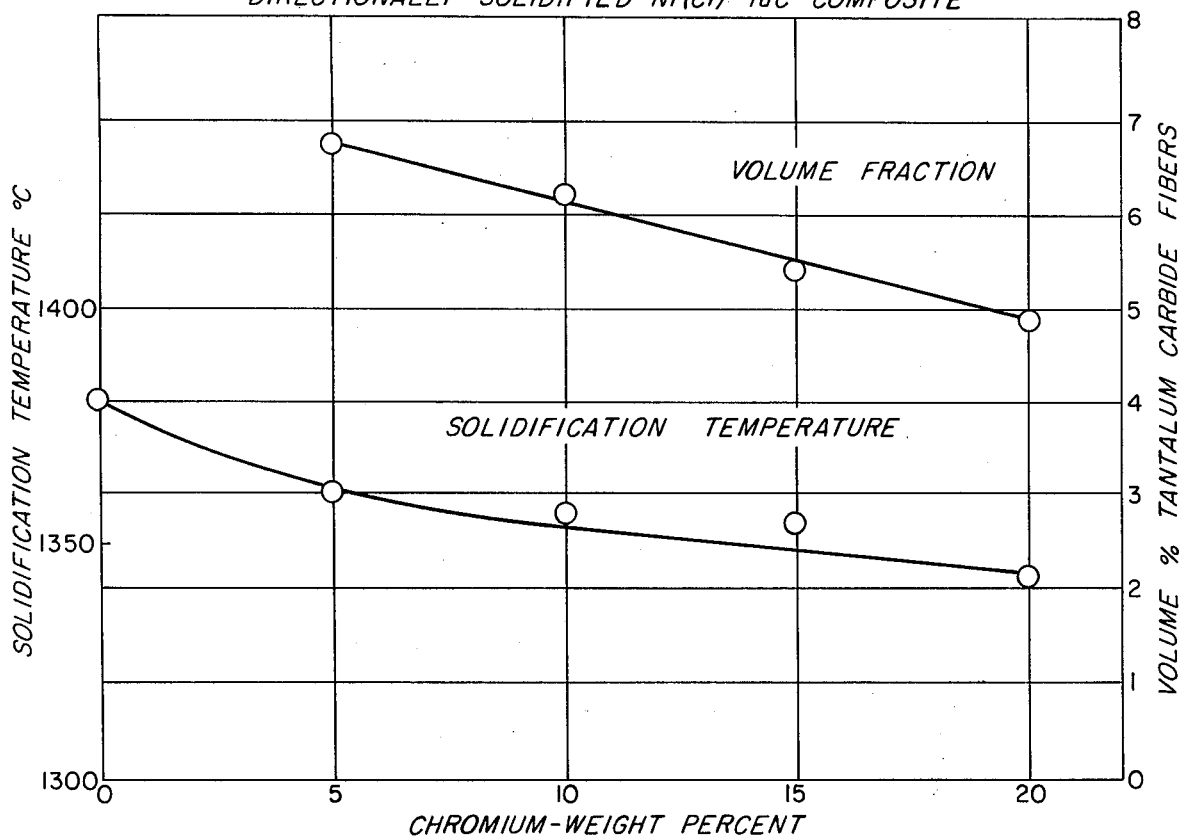
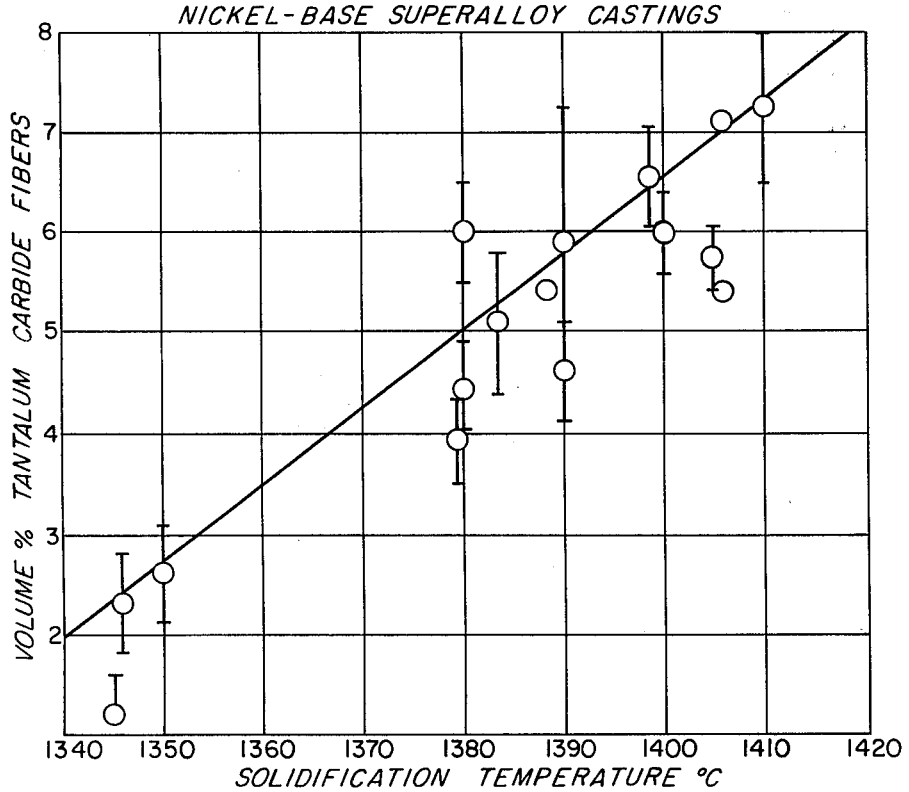

SECTIONS OF PHASE DIAGRAMS

NICKEL-TUNGSTEN

ALUMINUM-NICKEL

CHROMIUM-NICKEL

DIRECTIONALLY SOLIDIFIED NICKEL-BASE EUTECTIC ALLOYS

The present invention relates to eutectic superalloy articles and compositions and more particularly to such articles and compositions which include a superalloy matrix reinforced with aligned carbide fibers.

The performance requirements for gas turbine engines such as those which power aircraft are constantly increasing with advanced designs. Hence, there is a continuing need for improved materials for gas turbine components which operate in high temperature environments. These materials are critical in affecting overall engine performance and can allow designers to increase power generated, operating temperatures, component life, or a combination of these factors.

The development of nickel-base superalloys widely used for many years in the gas turbine engine art has reached a point at which advances are based not only on the superalloy itself, but also the orientation of phases of the superalloy or inclusions of reinforcing members such as fibers which can be formed in situ during the solidification of the alloy. One form of such solidification which has been used and widely reported is generally referred to as directional solidification. It was recognized that such directional solidification of eutectic alloys is a feasible method for producing metallic composites including aligned lamellae or fibers as a reinforcing phase dispersed in the matrix. In these directionally solidified eutectic alloy composites, the strength properties at high temperatures greater than 1000° C. are provided by the fiber reinforcing phase. Thus, in order to improve the high temperature stress-rupture properties, it is desirable to increase both the fiber volume fraction and the number of fibers in the composite.

Heretofore, Walter et al., U.S. Pat. No. 3,793,012 disclosed the preparation of unidirectionally solidified nickel-base carbide reinforced cast superalloy bodies having high strength and high stress-rupture properties particularly at elevated temperatures. The reinforcing fibers present in the matrix were aligned single crystal fibers of metal monocarbides. The range of compositions of the unidirectionally solidified castings in weight percent was reported to be about 6.5 to 10% chromium, 14 to 23% tantalum, 1 to 1½% carbon, a trace to 6% aluminum, a trace to 1% titanium, a trace to 8.5% cobalt, a trace to 5.0% molybdenum, and the balance essentially nickel. A preferred composition designated as TaC-1900 had high strength and high stressrupture properties as illustrated by a life to rupture time of 312 hours under a stress of 20,000 psi and at a temperature of 1832° F. (1000° C.).

A further improvement in the stability and high temperature properties of unidirectionally solidified anisotropic metallic composites is disclosed by R. W. Smashey, U.S. application Ser. No. 366,047, filed June 1, 1973, (13DV-6031) and assigned to the assignee of the present invention, which discloses an article having a unidirectionally solidified, anisotropic metallic composite body which includes a solid solution matrix and an aligned carbide reinforcing fibrous phase embedded in the matrix. This matrix is a nickel base superalloy and includes by weight at least about 2% rhenium to strengthen the matrix, along with less than 0.8% titanium to avoid generation of phases or compounds which would tend to degrade the carbide reinforcing fibrous phase. Smashey reported that a large drop in high temperature strength seems to occur in some nickel-base eutectic alloy strengthened by tantalum carbide fibers as a result of gamma prime film formation about the fibers. It appeared that the precipitation of chromium rich $M_{23}C_6$ needles at the fiber/matrix interface not only degraded the fibers, but also acted as stress risers, thereby contributing to reduced high temperature structural strength. He discovered that the inclusion of the element rhenium had a significant effect in strengthening the matrix particularly to increase the high temperature stress-rupture life. In addition, Smashey disclosed that the presence of even relatively small amounts of titanium, for example as low as about 1 weight percent, while desirable to effect the gamma prime precipitation formation, severely reduced the amount of tantalum carbide fibers that can form.

While both Walter et al. and Smashey were able to produce unidirectionally solidified nickel-base superalloy composites having improved stress rupture properties, neither of the references is concerned with increasing the fiber density or the fiber volume fraction of the reinforcing phase and thereby to provide improved high temperature strength properties.

In accordance with the present invention, I have discovered a unidirectionally solidified anisotropic metallic casting having improved high temperature properties comprising a matrix of a nickel-base superalloy including by weight at least 2% rhenium and at least 6% tungsten, but containing less than 5% aluminum and less than 7% chromium and an aligned reinforcing fibrous phase of tantalum monocarbide embedded in the matrix. These castings have substantially increased fiber volume fractions and fiber densities over fiber reinforced nickel-base superalloy castings known heretofore. In addition, I have found that these castings can be produced having a substantial improvement in stress-rupture properties at an elevated temperature.

The invention is more clearly understood from the following description taken in conjunction with the accompanying drawing in which:

FIG. 1 is a graph showing the volume fraction and solidification temperatures of a directionally solidified nickel (chromium)-tantalum carbide composite as a function of the weight percent of chromium;

FIG. 2 is a graph showing the volume percent of tantalum carbide fibers in a series of directionally solidified nickel base superalloy castings as a function of the melting temperatures of the alloys;

Figure 3:
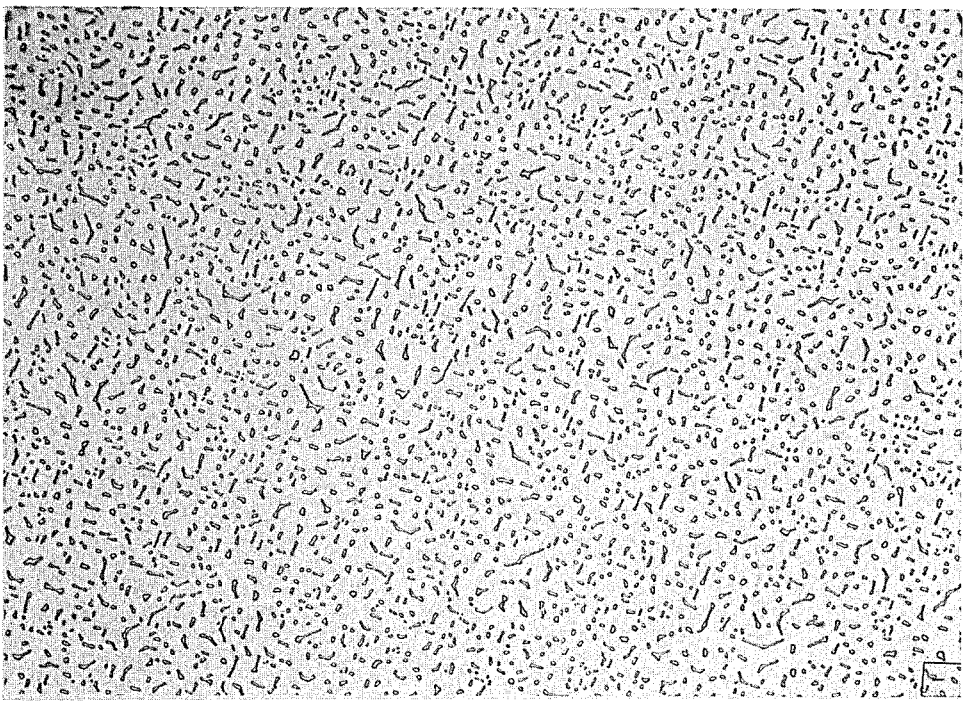
FIG. 3 is a photomicrograph illustrating the directionally solidified superalloy of the present invention.
Figure 4:
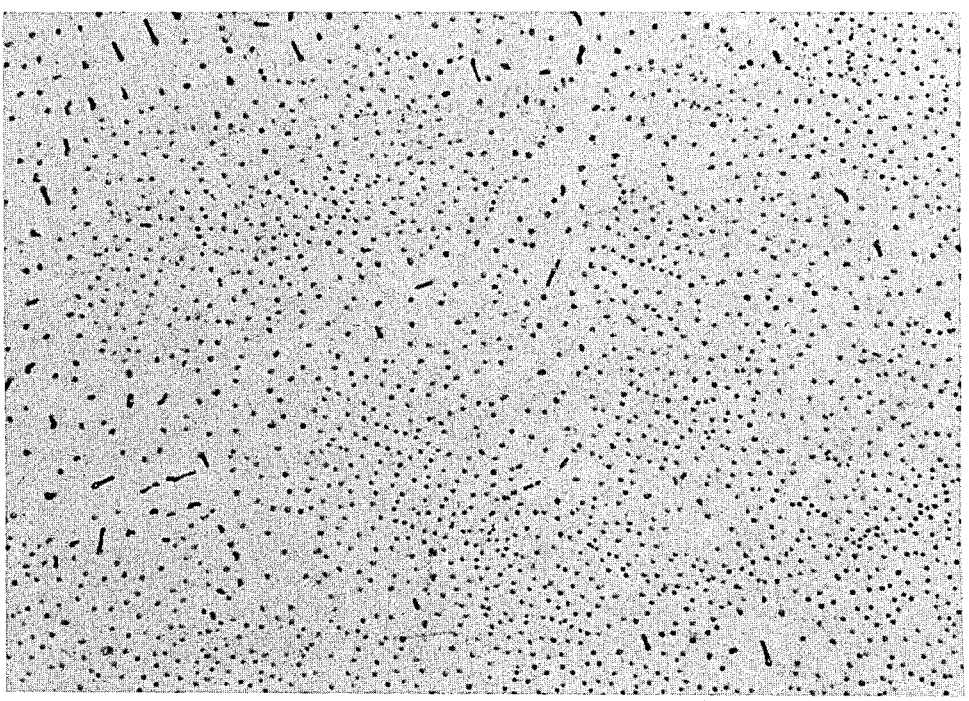
FIG. 4 is a photomicrograph illustrating a nickel base directionally solidified superalloy of the prior art Walter et al. patent and designated as TaC-19 Ta.

The composite structures formed by directional solidification of the eutectic alloys of the present invention consists of a nickel-base matrix phase with an aligned monocarbide fiber reinforcing phase embedded in the matrix. The matrix phase generally provides strength properties below about 1700° F. and may also contain a strengthening precipitate, e.g., $Ni_3Al$ which begins to dissolve at about 1832° F. However, it is the tantalum monocarbide reinforcing phase which imparts high strength at temperatures in excess of about 1700° F. These high temperature strength properties may be most sensitively measured by stress-rupture tests well-known in the art. Time-temperature parameters have been devised to assist in correlating and extrapolating stress-rupture data. One particularly useful stress-rupture parameter is the Larson-Miller parameter given by the equation $$P = T (C + \log t) \times 10^{-3}$$

wherein $T$ is temperature in degrees and $t$ is rupture time in hours. A plot of this parameter as a function of applied stress is a satisfactory way to report stress-rupture data. Another way of showing or illustrating the high temperature strength properties is in terms of time to rupture as a function of the temperature and the applied stress.

Previously, it was mentioned that the reinforcing phase provides the high temperature strength properties. Therefore, my invention involves two primary factors. The first of these is to increase the fiber density of the composite which is defined as the number of fibers per $cm^2$ of composite. The second factor is directed to increase the fiber volume fraction of the composite, which is defined as the volume occupied by the fibers as compared to the total volume of composite. Thus, an increase in the fiber density and/or an increase in the fiber volume fraction produces an increase in the high temperature strength of the composite.

I have found that both of these factors can be controlled by certain physical properties of the nickel-base eutectic alloy which are directly a function of the alloy composition. Thus, there are certain general rules which are applicable in preparing the alloys. The first rule is that as the solidification temperature of the alloy increases, the fiber volume fraction also increases. This principle is readily evident from FIG. 1 for the system nickel (chromium)-tantalum carbide. It is shown that the volume fraction of fibers is directly proportional to the solidification temperature of the alloy. The nickel (chromium)-tantalum carbide compositions are a model system having a matrix phase of nickel with varying amounts of chromium and a reinforcing phase of tantalum carbide. More complicated nickelbase superalloys systems of this invention containing tantalum carbide fibers is represented by FIG. 2, wherein the volume fraction of tantalum carbide fibers is plotted against the solidification temperature of the alloy. It is observed that as the solidification temperature increases from about 1340° to about 1410° C., the volume fraction of tantalum carbide fibers increases substantially from about 2 volume percent to up to about 7 volume percent and greater.

The second rule is that as the rate of directional solidification (R) increases, the fiber density also increases. In a given casting process there is a rate ($R_{max}$) which is the maximum rate of fiber formation. This rate ($R_{max}$) is a function of the alloy composition for a fixed thermal gradient.

During directional solidification of the eutectic alloy, there is often a freezing range or mushy zone ($\Delta T$) between the solidus and the liquidus isotherms, the extent of which depends upon the composition of the matrix alloy. Rule three states that as the freezing range increases, the maximum rate at which the eutectic alloy may be solidified without formation of the undesirable cell or dendrite structure decreases. Since fiber density is directly proportional to solidification rate, it follows that an increase in the freezing range, $\Delta T$, will decrease the fiber density. A large freezing range, as for example about 30° C., requires a very low solidification rate, i.e., less than 0.3 cm. per hour, or a very high temperature gradient during directional solidification, i.e., about 300° C. per cm., to avoid cell or monocarbide dendrite formation. High gradients are difficult to obtain for shapes with thickest dimensions exceeding about ½ inch. Low solidification rates lead to a low fiber density when high fiber densities are required for maximum strength.

Figure 5:
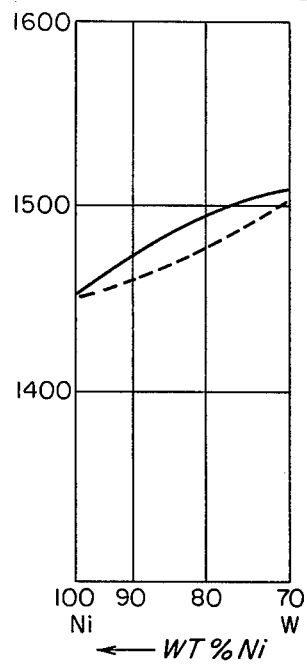
FIG. 5 is a portion of the binary phase diagram for the system of nickel-tungsten.
Figure 6:
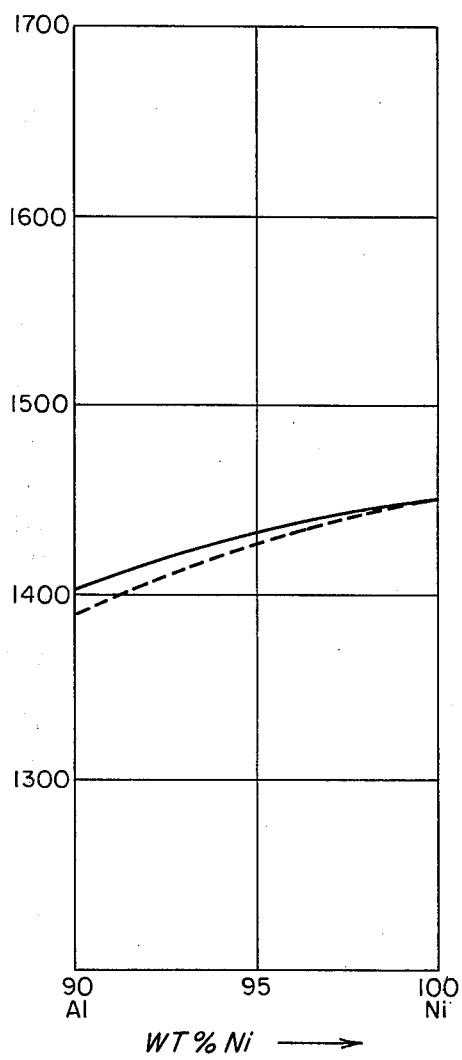
FIG. 6 is a portion of the binary phase diagram for the system of nickel-aluminum.
Figure 7:
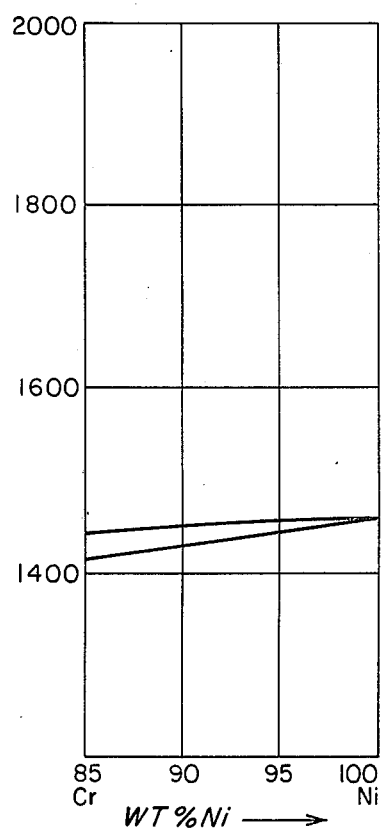
FIG. 7 is a portion of the binary phase diagram for the system of nickel-chromium.

Referring now to FIGS. 5–7, portions of binary phase diagrams are shown for nickel together with other elements which either increase or decrease the solidification temperature or increase the freezing range of the alloy. FIG. 5 indicates that as the amount of tungsten increases, the melting temperature of the alloy also increases, which results in an increase in the fiber volume fraction in the directionally solidified alloy. FIG. 6 shows that in the nickel-aluminum system, as aluminum increases the melting temperature decreases, which results in a decrease in the fiber volume fraction of the casting. The nickel-chrome system shown in FIG. 7 indicates that as the concentration of chromium increases, the melting temperature decreases and in addition, the length of the mushy zone increases which results both in a decrease in the fiber volume fraction and a decrease in the maximum allowable solidification rate and, therefore, a decrease in fiber density.

As the nickel-base alloy becomes more complex in terms of the number of alloying elements, the applicability of the binary phase diagrams becomes less. However, experience has shown that selection of alloying elements based upon the binary phase diagrams is qualitatively correct. Accordingly, the unidirectionally solidified casting of the present invention is of a melt composition consisting essentially in weight percent of 6 to 15% tungsten, 2 to 7% rhenium, 0 to 5% cobalt, 0 to 5% molybdenum, 2 to 7% vanadium, 0 to 4% aluminum, 0 to 7% chromium, 10 to 23% tantalum, 0.1 to 1.5% carbon and the balance essentially nickel and incidental impurities.

A critical part of my invention in designing the alloy composition is the presence of high amounts of tungsten which functions as a solid solution strengthener and contributes to gamma prime strengthening. As is shown in the phase diagram in FIG. 5, the presence of tungsten significantly increases the solidification temperature of the nickel-tungsten binary alloy and correspondingly, causes an increase in the volume fraction of the TaC fibers of the unidirectional casting without significantly increasing the freezing range. Broadly, the alloy contains from about 6 to 15% by weight of tungsten, with the preferred range being about 6 to 11% by weight.

An important matrix strengthener included in the alloy is rhenium. Unlike the element tungsten, rhenium is not a carbide former. It has been found that the inclusion of less than about 2% by weight of Re does not improve stress-rupture strength appreciably. Therefore, the present invention includes the element Re in the amount of at least about 2% by weight. From a practical point of view, based on the high cost of Re and the decreasing benefit in greater amounts, it is less practical to include greater than about 7% Re.

Titanium is an example of an alloying element that would sharply increase the freezing range ΔT and thereby reduce the maximum solidification rate obtainable before cell or dendrite formation occurs. It also sharply reduces the solidification temperature of the alloy, which, in turn, acts to reduce the volume fraction of tantalum carbide fibers. Thus, titanium should not be present in excess of about 1 weight percent.

The element cobalt substitutes for nickel up to about 10% by weight and contributes to the solubility relationship. It is included in the alloy composition in amounts up to 5% by weight and preferably present in 3–5% by weight without significantly affecting the freezing range or the volume fraction. However, at higher amounts, for example greater than about 10%, it tends to result in matrix instabilities.

An element which increases the freezing range is molybdenum and it is preferred to omit the element from the composition. It can be, however, tolerated up to about 5% by weight to increase the strength and solvus temperature of gamma prime, but in excess of that amount it increases the tendency to form an undesirable W-Ni-C phase.

Vanadium is included in the composition in the range of about 2 to 7% by weight. It reacts with nickel to form gamma prime and can replace Ti which is substantially removed from the composition of the alloy of the present invention. Below about 2% by weight vanadium, the alloy tends to become somewhat weaker though still an improved composition. In excess of 7% by weight, oxidation resistance tends to decrease progressively. The presence of vanadium in the prescribed amounts does not significantly affect the solidification temperature or increase the freezing range.

Another gamma prime former which is included in the composition is aluminum in amounts up to 4% by weight. However, excessive amounts, greater than 4% by weight, decrease the melting temperature of the alloy significantly and thereby decreases the volume fraction of the reinforcing fiber phase. Aluminum also appears to increase the freezing range, although the binary phase diagram as illustrated by FIG. 6 indicates the solidus to be uncertain.

Chromium provides solid solution strengthening and oxidation resistance. In maximizing fiber volume fraction and fiber density, chromium has a tendency to increase the freezing range and should be maintained at a relatively low level up to about 7% by weight. Further, excess amounts of chromium lower the solidification temperature and thereby reduce the volume fraction of tantalum carbide fibers.

The principal carbide former in the present invention is the element tantalum. It is included within the range of about 10 to 23% by weight and preferably in the range of 14–19% by weight. In addition to acting as a carbide former, Ta also is a gamma prime former and up to 3% Ta above that required to react with all of the carbon may be added to substitute for Al in the gamma prime. Amounts of Ta less than about 10% by weight are insufficient to provide the high fiber density and volume fraction of the present invention. However, greater than about 23% by weight, Ta in combination with Al, V and W levels higher than those prescribed herein, exceed matrix solubility resulting in undesirable phases or carbide morphologies.

Required in the composition of the present invention is the element carbon which is needed to combine with Ta or with Ta and V to produce the carbide fibers. Less than 0.1% by weight is insufficient to form the carbide fibers. Greater than about 1.5% by weight C produces free carbon because there are not enough desirable carbide formers in the composition to react with the carbon. However, any such free carbon will slag off or will collect in the sorting-out portion of the casting which is adjacent the chill and which is later removed from the cast article. The amount of carbon included in the composition of this invention is a function of the amount of Ta, and of V, when included, sufficient to form a monocarbide of one or both such elements.

In order to provide the article of the present invention, the alloy having the above described careful balance of elements must be unidirectionally solidified to enable the carbide eutectic fibers to form integrally within and be bonded to the reinforced solid solution matrix. Such unidirectional solidification can be conducted in one or more of the many methods and using apparatus well known and widely reported in the art as described by C. T. Sims et al., *The Superalloys*, Wiley & Sons (1972).

During the evaluation of the present invention, a large number of alloy compositions were evaluated. The following Table I lists the compositions of some of such alloys. All percentages in this table and elsewhere in the specification are percents by weight unless otherwise stated. The alloy examples in Table I have been grouped to facilitate reference to the discussion which follows and to the comparative data of other tables or figures of the drawing.

TABLE I

| Example | Ni | Ta | Cr | Al | Co | W | Re | Mo | Ti | V | C |
|---|---|---|---|---|---|---|---|---|---|---|---|
| Ex. I (TaC-2024) | 54.1 | 23.3 | 7 | 6.5 | 8 | | | | | | 1.1 |
| Ex. II (TaC-19Ta) | 54.6 | 18.3 | 6.7 | 5.0 | 8.4 | | | 5.0 | 0.84 | | 1.1 |
| Ex. III (TaC-1912) | 54.1 | 18.3 | 7 | 6.5 | 8 | | | 5 | | | 1.1 |
| Ex. IV (NiKs-16) | 51 | 21.7 | | 2 | 5 | 11 | 3 | | | 5 | 1.33 |
| Ex. V (NiKs-15) | 53 | 21.7 | | | 5 | 11 | 3 | | | 5 | 1.33 |
| Ex. VI (NiKs-1) | 49 | 21.7 | | | 5 | 15 | 3 | 5 | | | 1.33 |
| Ex. VII (Niks-24) | 54 | 14.0 | 2 | 2 | 5 | 11 | 3 | 3 | | 5 | 0.99 |
| Ex. VIII (NiKs-18) | 53 | 21.7 | | 2 | 5 | 11 | 3 | 3 | | | 1.33 |

Table II shows the solidification rate and the solidification temperature of the alloy compositions corresponding to those Examples I–VIII. In addition, the fiber volume percent and the fiber density were determined. The ingots were then tested to determine the stress rupture properties. The data in Table II supports the first general rule set forth hereinabove, namely that as the solidification temperature increases, the fiber volume percent increases and the fiber density increases also. In addition, the stress rupture data showed that the compositions of the present invention substantially increase the rupture life over those disclosed in the prior art alloy compositions as represented by Examples I–III.

TABLE 2

Physical and Mechanical Properties of Directionally Solidified Nickel Base Alloys

| Examples | Solidification Rate (in/hr) | $T_{mp}$ °C. | Fiber Volume % fiber vol/total vol. | Fiber Density fibers/cm$^2$ | Stress-Rupture life (hrs.) 1700° F. 40,000 psi | 1950° F. 25,000 psi |
|---|---|---|---|---|---|---|
| I | ¼″ | 1345° | 1.2 | 0.8 × 10$^5$ | 57.8 | 2.4 |
| II | ¼ | 1346° | 2.3 | — | 41.4 | 1.03 |
| III | ¼ | 1350° | 2.6 | 2.1 × 10$^5$ | 62.7 | 1.4 |
| IV | ¼ | 1395° | 4.6 | 3.3 × 10$^5$ | 166.2 | 47.2 |
| V | ¼ | 1400° | 5.6 | 2.9 × 10$^5$ | 1.4 | 63.2 |
| VI | ¼ | 1400° | 6.0 | 5.9 × 10$^5$ | 8.5 | 995.3 |
| VII | ¼ | 1395° | 6.2 | 5.9 × 10$^5$ | 1527.2 | 212.6 |
| VIIIA | ¼ | 1400° | 5.7 | 2.9 × 10$^5$ | 17.6 | 4.3 |

Referring now to Table III, the rate of directional solidification is shown as it affects the fiber density and stress rupture properties of the alloy. It has been found that when the rate of directional solidification is increased from ¼ to ½ to 1 inch per hour, the fiber density is substantially increased and there are substantial improvements in the stress rupture life at low temperatures of 1700° F. and at high temperatures of 1950° F. The higher rates of directional solidification are permitted as a result of the tailoring of the composition which involves the complete omission of chromium together with low amounts of aluminum of 2% and the increased amounts of tungsten to 11%.

TABLE 3

Effect of Directional Solidification Rate

| Examples | Solidification Rate (in/hr) | $T_{mp}$ °C. | Fiber Volume % fiber vol/total vol. | Fiber Density fibers/cm$^2$ | Stress-Rupture life (hrs.) 1700° F. 40,000 psi | 1950° F. 25,000 psi |
|---|---|---|---|---|---|---|
| VIIIA | ¼″ | 1400° | 5.7 | 2.9 × 10$^5$ | 17.6 | 4.3 |
| VIIIB | ½″ | 1400° | 5.3 | 8.8 × 10$^5$ | 91.8 | 87.8 |
| VIIIC | 1″ | 1400° | | 19.2 × 10$^5$ | | |

It will be appreciated that the invention is not limited to the specific details shown in the Examples and illustrations and that various modifications may be made within the ordinary skill in the art without departing from the spirit and scope of the invention.

I claim:

1. An article of manufacture having improved high temperature properties, improved fiber volume fraction and improved fiber density comprising a unidirectionally solidified anisotropic metallic casting comprising
   a. a matrix of a nickel-base superalloy consisting essentially of, on a weight basis, 6–15% tungsten, 2–7% rhenium, 0–5% cobalt, 0–5% molybdenum, 2–7% vanadium, 0–4% aluminum, 0–7% chromium, 10–23% tantalum, 0.1–1.5% carbon and the balance being essentially nickel; and
   b. an aligned eutectic carbide reinforcing fibrous phase embedded in the matrix.

2. An article of manufacture having improved high temperature properties, improved fiber volume fraction and improved fiber density comprising a unidirectionally solidified anisotropic metallic casting solidified at a rate greater than ¼ inch per hour comprising
   a. a matrix of anickel-base superalloy consisting essentially of, on a weight basis, 6–15% tungsten, 2–7% rhenium, 0–5% cobalt, 0–5% molybdenum, 2–7% vanadium, 0–4% aluminum, 0–7% chromium, 10–23% tantalum, 0.1–1.5% carbon and the balance being essentially nickel; and
   b. an aligned eutectic carbide reinforcing fibrous phase embedded in the matrix.

3. The article of claim 2, wherein the predominant fibrous phase is tantalum carbide.

4. The article of claim 2, wherein the casting consists essentially in weight percent of about 54% nickel, 11% tungsten, 3% rhenium, 5% cobalt, 3% molybdenum, 5% vanadium, 2% aluminum, 2% chromium, 14% tantalum and 1% carbon.

5. The article of claim 2, wherein the melting temperature of the composition is at least 1390° C.

6. The article of claim 2, wherein the fiber volume percent of the casting is at least 4.0.

7. The article of claim 2, wherein the casting is characterized by a stress-rupture life at a temperature of 1950° F. and a stress of 25,000 psi of at least 40 hours.

8. The article of claim 2, wherein the casting is characterized by a stress-rupture life of
   a. at least 1500 hours at a temperature of 1700° F. and a stress of 40,000 psi, and
   b. at least 200 hours at a temperature of 1950° F. and a stress of 25,000 psi.

9. An alloy capable of being unidirectionally solidified to provide a composite casting having improved high temperature properties, improved fiber volume fraction, improved fiber density, and capable of forming an aligned eutectic carbide reinforcing fibrous phase embedded in the alloy matrix during unidirectional solidification of the alloy, said alloy comprising a nickel base superalloy consisting essentially of, on a weight basis, 6–15% tungsten, 2–7% rhenium, 0–5% cobalt, 0–5% molybdenum, 2–7% vanadium, 0–4% aluminum, 0–7% chromium, 10–23% tantalum, 0.1–1.5% carbon, and the balance being essentially nickel.

10. An alloy capable of being unidirectionally solidified at a rate greater than ¼ inch per hour to provide a composite casting having improved high temperature properties, improved fiber volume fraction, improved fiber density, and capable of forming an aligned eutectic carbide reinforcing fibrous phase embedded in the alloy matrix during unidirectional solidification of the alloy, said alloy comprising a nickel base superalloy consisting essentially of, on a weight basis, 6–15% tungsten, 2–7% rhenium, 0–5% cobalt, 0–5% molybdenum, 2–7% vanadium, 0–4% aluminum, 0–7% chromium, 10–23% tantalum, 0.1–1.5% carbon, and the balance being essentially nickel.

11. The alloy of claim 10, wherein the melting temperature is at least 1390° C.

12. The alloy of claim 10, consisting essentially in weight percent of about 54% nickel, 11% tungsten, 3% rhenium, 5% cobalt, 3% molybdenum, 5% vanadium, 2% aluminum, 2% chromium, 14% tantalum and 1% carbon.

* * * * *